United States Patent [19]

Castellani et al.

[11] 4,281,057

[45] Jul. 28, 1981

[54] VARIABLE PRE-SPIN DRYING TIME CONTROL OF PHOTORESISTS THICKNESS

[75] Inventors: Eugene E. Castellani, Putnam Valley; Ian M. Croll, Pleasantville; Aloysius T. Pfeiffer, Peekskill; Lubomyr T. Romankiw, Briarcliff Manor, all of N.Y.

[73] Assignee: International Business Machines Corporation, Armonk, N.Y.

[21] Appl. No.: 766,308

[22] Filed: Feb. 7, 1977

Related U.S. Application Data

[63] Continuation of Ser. No. 697,794, Jun. 18, 1976, abandoned, which is a continuation of Ser. No. 510,954, Oct. 2, 1974, abandoned, which is a continuation of Ser. No. 311,006, Nov. 30, 1972, abandoned.

[51] Int. Cl.³ .................. G03C 5/00; G03C 1/76; G03C 1/86; G03C 1/94
[52] U.S. Cl. .................. 430/270; 430/313; 430/314; 430/323; 430/324; 430/325; 430/935
[58] Field of Search .................. 96/36, 36.2; 204/15

[56] References Cited

U.S. PATENT DOCUMENTS 3,576,722  4/1971  Fennimore .................. 204/15

OTHER PUBLICATIONS

"Plating", May 1969 pp. 505-510, Puffek.
Proceedings of the Second Kodak Seminar on Microminaturization, Apr. 4-5, 1966, pp. 36-43.
Data Release, Incidental Intelligence about Kodak Resists, pp. 8-10.
Data Release, Kodak Autopositive Resist Type 3, Kodak Pamphlet No. p-194 (1969).

*Primary Examiner*—Edward C. Kimlin
*Attorney, Agent, or Firm*—Julius Jancin, Jr.; Bernard N. Wiener; Graham S. Jones, II

[57] ABSTRACT

Resist is applied to a surface with a syringe, or other suitable dropper, equipped with a millipore filter to remove contaminants. The surface is completely flooded with resist. Resist is allowed to remain on the surface of the evaporated metal for a period of time prior to spin coating. Allowing resist to remain on the surface prior to coating produces a uniform film. For a 2 micron thick uniform resist coating, a minimum of 15 seconds is allowed prior to spinning while in the case of a 4 micron thick resist coating a much longer period is allowed.

For the application of a 2 micron film, the resist material after partial drying for approximately 15 seconds is spun at 2000 rpm for 30 seconds. In order to apply a 5 micron thick resist film, resist is spun at 2000 rpm for 30 seconds after partial drying for approximately 10 minutes.

9 Claims, 7 Drawing Figures

VARIABLE PRE-SPIN DRYING TIME CONTROL OF PHOTORESISTS THICKNESS

This is a continuation of application Ser. No. 697,794, filed June 18, 1976, which is a continuation of Ser. No. 510,954 filed Oct. 2, 1974 which is a continuation of Ser. No. 311,006 filed Nov. 30, 1972, all abandoned.

BACKGROUND OF THE INVENTION

1. Field of the Invention

This invention relates to a process of forming thick layers of photoresist upon a substrate by the spin resist technique. More particularly the invention relates to a novel method of making fine line conductors suitable for use in the manufacture of microcircuits for the connection and interconnection of monolithic circuits as well as for the manufacture of windings in integrated recording heads. Further, the invention relates to a novel method of applying a uniform photoresist film and a method of forming fine line patterns therefrom.

2. Description of the Prior Art

With monolithic circuitry in which a large number of circuits may be formed over a small area, the connection and interconnection of such circuits have caused serious problems. Many such circuits require relatively high currents for proper operation, and yet the space available for the carrying of such currents to monolithic chips is severely limited. Prior art devices have proposed multilayer packages for the fabrication of the required number of circuit lines with a cross-sectional area sufficiently large to carry the current needed. The fabrication of such multilayer circuits often result in low yields since it is a multistep process in which the layers must be built up, properly registered, and interconnected.

The manufacture of fine-lines, in the order of microns, using etching techniques is well known in the semiconductor manufacturing art. The method consists of the evaporation of a thin film of conductive metal followed by the application of a thin film of photoresist. The film is exposed and developed, after which the metal may be etched. Very thin photoresist films, usually of less than a micron in thickness, are deposited for such applications since all that is required is that they withstand the metal etchant. Because of the thinness of the photoresist film, a relatively large percentage variation in thickness over the film can be tolerated, since such percentage variation usually amounts to little actual thickness variation and it is the actual thickness variation which causes under- or over-exposure of portions of the resist. Although the lines produced by such an etching process may be of micron widths, the thickness of the lines is usually of an order of magnitude thinner so as to limit the amount of undercutting inherent in the etching process, thus obtaining better control of the cross-sectional area of the conductor. Because the thickness of these lines is relatively thin in comparison to their width, the cross-sectional area of the lines is minimized, thereby minimizing their current carrying capacity. Thus, the lines produced by such a process, although suitable for the manufacture of circuits on the semiconductor chip itself, do not have the current carrying capacity necessary for their use in the connection and packaging of such chips. The deposition of thicker metal films for use in such an etching process is of no advantage since it requires the formation of wider lines so that the inherent undercutting does not cause lifting of the photoresist film from the substrate with trapezoidal or even triangular sections formed during the etching process.

Another application for the use of ultra-fine line circuitry with maximum current carrying capacity is in the manufacture of miniaturized integrated magnetic recording heads as discussed by Valstyn, "Integrated Head Developments", Annuls New York Academy of Sciences, Vol. 189, p. 191. Such devices require ultra-narrow conductors with maximum current carrying capacity so as to obtain a large number of conductor turns in a small area in order to produce a large quantity of magnetic flux. Prior art miniaturized heads have contemplated the use of copper conductors 250 microns wide by 6 microns thick. Such dimensions, although yielding an overall cross-sectional area larger than that contemplated by this invention, limit the number of conductor turns, thereby limiting the magnetic flux produced. It can be seen that by increasing the thickness to width ratio, or aspect ratio, from that which has heretofore been obtained for such devices, 0.54, the number of turns may be increased without affecting the current carrying capacity, thereby increasing the total magnetic flux produced. As previously discussed, because of the inherent undercutting in the etching process, there is a maximum aspect ratio that can be obtained from such a process. In a typical etching process aspect ratios of greater than 0.4 result in severe undercutting, often causing complete disappearance of the line produced. For example, it is impossible using the conventional etching techniques to form 4 micron wide lines on 8 micron centers in a metal film whose thickness is greater than 1.8 microns.

Because of the limited aspect ratio obtainable in an etching process, it has been proposed to employ an additive metal plating process to achieve thick fine line circuitry with large current carrying capacity in densely packed areas. Heretofore, it has been impossible to produce ultra-fine line circuits with widths of less than 5 microns as contemplated by this invention and still build up the required plating thickness to yield large aspect ratios. In order to produce densely packed, fine line circuits, such as 5 micron wide lines on 8 micron centers, as contemplated by this invention, extremely accurate resolution during exposure is required. Underexposure of a positive photoresist, i.e., a resist which becomes soluble upon exposure to ultraviolet radiation, will result in incomplete removal of the resist and subsequent nonplating of the circuit lines in those areas. The circuit lines produced due to such underexposure will be narrower than desired, often resulting in the breakage of a line and a corresponding open circuit. Overexposure of a positive photoresist results in wider lines than desired, and in the case of densely packed circuitry such as the 3 microns spaces contemplated by this invention, shorting between lines may result. Proper exposure and development of a photoresist pattern, so as to faithfully reproduce the mask pattern, becomes critical in the manufacture of such fine line circuitry. Proper exposure can be obtained only if the photoresist is of uniform thickness. Unlike the previously discussed semiconductor etching process, wherein the photoresist is applied as an extremely thin film to minimize the effect of nonuniformity, the resist in a plating process must be applied to a thickness equal to the thickness of the plating desired. Attempts to obtain reliable fine line circuitry with aspect ratios greater than 0.4 have heretofore failed on account of the nonuniformity of the application of the resist, and subsequent incorrect development and exposure.

Also, additional problems arise where the resist must be coated upon a non-uniform by contoured substrate. Such may be the case where the insulation upon which the conductive pattern is to be deposited conforms to the contour of underlying conductors as in a multilayer circuit or multiturn miniaturized recording head. With such devices it is impossible to obtain completely uniform resist coatings since some excess will always flow to the valleys from the peaks. Completely uniform exposure is also impossible since the peaks and valley vary in distance from the light source. Because of such inherent non-uniformity, resist in the valley regions will be under-exposed as compared with the peak regions. Such under-exposure, as previously discussed, results in narrowing of the circuit lines.

OBJECTS OF THE INVENTION

It is an object of this invention to provide a new way to spin coat photoresist onto a substrate to provide films of desired thicknesses of photoresist.

It is an object of this invention to produce fine line conductors capable of carrying larger currents than was heretofore possible for conductors of such width.

It is another object of this invention to obtain fine line conductors with large thickness to width, or aspect ratios, whereby large cross-sectional areas in a limited space may be obtained.

It is yet another object of this invention to produce fine line circuitry suitable for the connection of monolithic chips in a single layer.

It is still another object of this invention to produce fine line conductors suitable for use as conductor windings in a miniaturized integrated magnetic recording head wherein the total magnetic flux is larger than has heretofore been obtained for such devices.

It is yet another object of this invention to form uniform conductor lines on non-uniform contoured substrates.

SUMMARY OF THE INVENTION

In accordance with this invention, a process is provided for producing a uniform layer of photoresist of a desired thickness. First, photoresist is flooded onto a substrate. Then the photoresist covered substrate is dried for a measured predetermined minimum stationary drying interval, which is varied in duration as a known function of the desired ultimate thickness of the photoresist at the completion of the process. The substrate with the photoresist is spun at a time commencing subsequent to the drying interval to produce a uniform coating.

The above objects are accomplished by utilizing an additive plating process in which a positive photoresist is uniformly applied to a film thickness equal to the plating thickness desired. Properly designed masks with build in compensating dummy patterns to provide uniform current density distribution during plating may be used. Also, the design may have varying line widths to compensate for the under-exposure of portions of the resist if it has been applied to a non-uniform substrate. Such a process comprises the steps of vacuum depositing a thin conductive metal on a substrate, flooding a positive liquid photoresist onto the conductive metal, partially drying the liquid resist, spinning the resist to produce a substantially uniform coating, baking, exposing and developing said resist using a properly designed mask so as to produce a pattern of the desired circuit, electroplating the desired circuit pattern onto the conductive metal layer, removing the resist and subsequently etching the conductive metal base from between the circuitry.

Further in accordance with this invention a uniform layer of photoresist is deposited by flooding a positive liquid photoresist onto the substrate. Then the liquid resist is partially dried for a variable time from 15 seconds to 45 minutes and the resist is then spun to produce a uniform coating with thickness of 2–5 microns, the thickness being proportional to the amount of time allowed for partial drying.

The foregoing and other objects, features and advantages of the invention will be apparent from the following more particular description of the preferred embodiment of the invention as illustrated in the accompanying drawing.

DETAILED DESCRIPTION OF THE PREFERRED EMBODIMENT

Figure 1A:
FIGS. 1a–g are diagrammatic sections illustrating successive steps in the construction of circuit lines made by the process contemplated by this invention.

Referring to FIG. 1, FIG. 1a depicts a substrate 2, upon which conductive lines are to be deposited. In an application where the conductive lines are to be used for the interconnection of chip circuitry, the substrate may consist of the silicon wafer itself from which the chips have been fabricated. Alternately, the chips may be mounted upon any suitable nonconductive substrate such as glass or ceramic, and the circuit lines contemplated by this invention then deposited thereon. In the fabrication of conductive windings for miniaturized integrated heads, the conductive windings for a single turn magnetic head may be deposited directly upon a magnetic substrate such as permalloy. A general, additive plating manufacturing process for such devices is described in "Batch Fabricated Thin Film Magnetic Recording Heads", Romankiw, L. T. et al., IEEE Trans. Magnetics MAG-6: 597–601. However, the width of the lines produced by such prior art manufacturing techniques are orders of magnitude larger, in the range of 250 microns, than the lines contemplated by this invention. In a multiturn version of such a miniaturized recording head, all but one conductor winding is separated away from permalloy by an insulator and a large number of lines are placed at very small spacings in the yoke of the head.

Figure 1B:
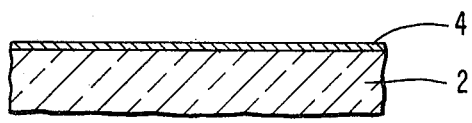

FIG. 1b shows the deposition of an adhesion layer of metal 4, upon the nonconductive substrate. Approximately 50 A to 100 A of adhesion metal is generally adequate between the substrate and the metal conductor. Tantalum, titanium, tungsten or niobium may be used to give good adhesion between an $SiO_2$ substrate and metal conductors of copper or gold.

Figure 1C:
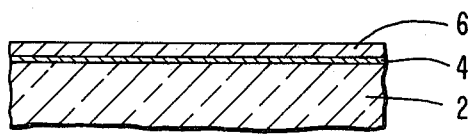

As shown in FIG. 1c, a thin layer of metal conductor 6, usually of the same metal as the metal to be plated and approximately 250 A thick is then evaporated over the adhesion metal to serve as a common cathode upon which the conductive lines may be electroplated.

After the substrate with the evaporated layers thereon has been cleaned and dried, a photoresist 8 is applied. Proper application of the photoresist and proper exposure through a properly designed mask is critical to the process. As previously discussed, a non-uniform application of resist without properly designed masks will cause under- or over-exposure resulting in broken or shorted lines due to the ultra-fine circuitry sought to be fabricated. The use of AZ 1350H photoresist manufactured by the Shipley Co., is suitable for this application. Example 1, column 4, of U.S. Pat. No. 3,201,239 to Neugebauer, et al discloses the two basic components of the AZ 1350H photoresist which are a phenolformaldehyde novolak resin (such as Anovol 429K, m-cresol-formaldehyde resin) and a 2,3,4-trihydroxybenzophenone-naphthaquinone-(1,2)-diazide-5-sulfonic acid ester sensitizer. However, the AZ 1350H photoresist does not contain the oil and dye described in the example. Where 2-4 microns high conductive circuits are to be fabricated, the resist may be applied at room temperature, as received, from the supplier without dilution. Where 4-6 microns high conductors are sought to be plated, 100-200 ml of resist is first poured into a wide mouth container and placed under vacuum for 24 hours in order to remove volatile materials from the resist formulation. Alternatively, to plate greater than 5 micron high conductors, a double application of resist may be used as discussed below in the specific examples. The resist is then applied to the surface of the evaporated metal with a syringe, or other suitable dropper, equipped with a millipore filter to remove contaminants. The surface of the evaporated metal is completely flooded with resist. The resist is now allowed to remain on the surface of the evaporated metal for a period of time prior to spin coating. We have found that allowing the resist to remain on the surface prior to spin coating produces a uniform film which was not heretofore possible, and as a result of which proper exposure and development of the resist may be obtained. Because of the fine line circuits sought to be produced, such as 5 micron wide lines with 3 micron wide spaces, proper exposure and development of the resist, as previously discussed, is critical for reliable circuitry. For a 2 micron thick uniform resist coating, a minimum of 15 seconds should be allowed prior to spinning while in the case of a 4 micron thick resist coating, much longer periods are allowed. Table I gives the times required prior to spinning at 2000 rpm to obtain the specified thickness.

TABLE I

| Thickness (Microns) | Time |
| --- | --- |
| 2.0 | 15 seconds |
| 2.5 | 1.5 minutes |
| 3.0 | 3.5 minutes |
| 4.0 | 70 minutes |
| 5.0 | 10.0 minutes |
| 10.0 | 27.0 minutes |
| 15.0 | 45.0 minutes |

A minimum time between resist applications and spin coating has been found to be critical for proper uniformity. Although the theory of why the resist must remain on the surface prior to spin coating is not fully understood, it is believed that there is a thickening and drying of the surface of the resist film while the underportion remains in a more fluid state, so that upon spinning, the underportion is moved outward and excess removed while the thicker surface layer remains relatively immobile during spinning and settles to a uniform coating. Absent this minimum time, unacceptable film thickness with large thickness variations have been found to exist.

For the application of a 2 micron film, the resist material after partial drying for approximately 15 seconds is spun at 2000 rpm for 30 seconds. In order to apply a 5 micron thick resist film, the resist should be spun at 2000 rpm for 30 seconds after partial drying for approximately 10 minutes.

The resist is then baked, aligned with a photomask and exposed using a collimated light source. A preliminary exposure and development step may be used to aid in developing out excess build up of resist which occurs in valleys or recesses of a non-uniform substrate that may have been formed over other conductors. Also, some non-uniformity and excess build up which may result at the edges can be remedied by the preliminary exposure step. However, edge build-up is generally minimal due to the waiting step between application and spinning of the resist and good uniformity at the center in the critical circuit areas usually exists. The removal of excess build-up from the perimeter may still be required for good electrical contact during plating.

After the preliminary exposure and development step the resist is then exposed using a properly designed circuit mask. Where the conductive lines are not uniformly spaced throughout the circuit, dummy plating areas which are later removed are designed into the mask to act as current thieves to insure uniform current distribution during plating. Also, where the surface to be plated is not flat, but rather, for instance, steps over previously deposited conductors, the line width of the mask may be made wider than that of the desired circuit width to compensate for underexposure in recess or valley areas.

Figure 1D:
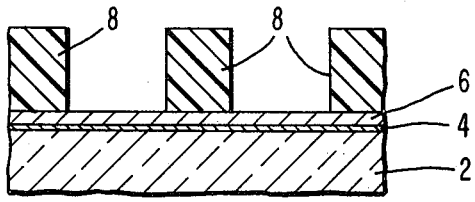

Exposure may be accomplished by the use of contact printing familiar to those skilled in the art of semiconductor manufacture, or alternatively, a noncontact projection printer with high degree of light collimation. Exposure time is critical, but with a uniform 2 micron film, 6 seconds of exposure to a mercury-arc of 550 foot-candles lamp intensity has been found proper, while for a 4 micron film, 9 seconds exposure is required. The exposed film is then developed using AZ-1350H developer supplied by the Shipley Co., giving the configuration as shown in FIG. 1d. Spray developing or brief immersion followed by spraying of fresh developer is preferred.

After examination, a second bake may be given to the resist to enhance its resistance to the plating bath solution. The copper plating bath make-up is given in Table II while a gold plating bath is given in Table III.

TABLE II

| Copper Bath | |
| --- | --- |
| $Cu(NO_3)_2$ | 50 g/l |
| $H_2SO_4$ | 15 ml |
| Formic Acid | 20 ml |
| Acetic Acid | 10 ml |
| Triton X-100 (10% solution by volume with water) | 4.0 ml |
| D. I. Wafer | to 1 liter |

TABLE III

| Gold Bath | |
| --- | --- |
| Selrex B.D.T. 200* | 1 gallon |
| Triton X-100 (10% solution by volume with water | 2-4 ml |

*used as received from Selrex Corp., Nutley, N.J.

In order to assure more uniform plating, the exposure mask defining the pattern to be plated, may be designed with dummy areas which are also plated but make up no part of the desired circuitry and which are later removed. Such dummy areas act as current thieves and cause even distribution of current over the entire plated area, thereby resulting in films with more uniform thickness. Whether or not to design the mask with current thief areas, or the particular design required, will depend upon the circuit pattern desired, i.e., if the circuit pattern is uniformly distributed throughout the substrate, there is less need for current thieves than in a case where the circuitry is densely packed in specific areas. We have found that a current density of approximately 40 milliamps/cm$^2$ results in uniform copper deposits, while 10 milliamps/cm$^2$ give uniform gold deposits although for each circuit pattern, the optimum current density may vary slightly.

Figure 1E:
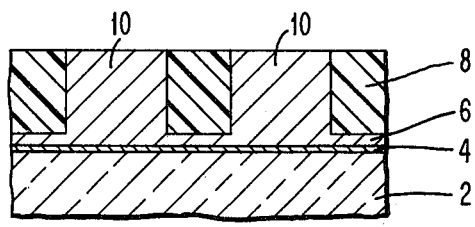

FIG. 1e shows the conductors 10, after plating. If copper plating is used, the copper circuitry may be plated with a protective metal layer such as nickel or gold. Use of gold plating eliminates the need for a protective top layer. Where the circuitry is being used for conductive windings in integrated head manufacture, an insulation layer and subsequently a layer of a magnetic metal such as permalloy may be deposited over the conductive windings.

Figure 1F:
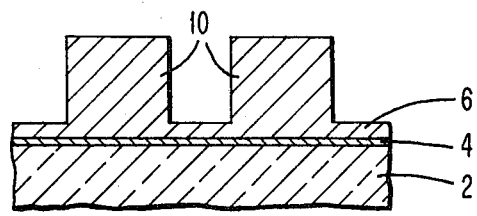
Figure 1G:
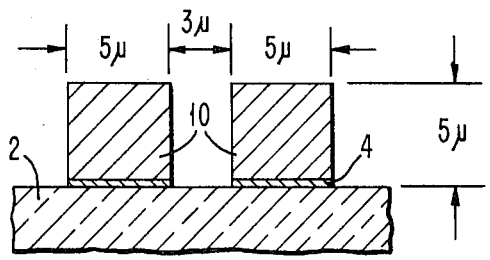

After plating, the resist is removed exposing the evaporated metal cathode film as shown in FIG. 1f. This may be removed by the use of a suitable etchant. Because of the large difference in the thickness between the plated circuitry as compared with the evaporated metal cathode film (250 A to 2-5 microns), the evaporated cathode film (250 A thick) will be completely removed before any appreciable dissolution of the electroplated circuitry takes place. The underlying metal adhesion layer, may then be etched away by a suitable etchant. In the case of titanium, a 5 percent solution of HF may be employed, while for chromium a 10 percent solution of AlCl$_3$ or 10 percent HCl may be used. For tantalum, sputter etching may be required. Again, because of the large variation in thickness between the adhesion layer and the exposed conductors (50 A to 2-5 microns) the adhesion layer may be completely etched away before any appreciable dissolution of the conductors occur. The resulting circuitry, with dimensions in the range of 5 micron widths and 5 micron thicknesses with 3 micron spaces is shown in FIG. 1g.

If current thief areas were required for the plating of the circuitry, an etch resist mask should be used to protect the circuitry prior to the etching of the thieves. Since the thief area is large in proportion to the circuit width and spaced an adequate distance away from the circuit lines themselves, application, exposure and development of an etch resist is not critical.

EXAMPLE I

Five micron thick copper lines, 5 microns wide with 3 micron spaces between lines were deposited on a SiO$_2$ insulation, which had been coated over a permalloy film which in turn had been deposited on a Si substrate for the fabrication of conductive windings in the manufacture of an integrated recording head. 50 A of Ti was evaporated at 150° C. onto the SiO$_2$ insulation after which a layer of 250 A of copper was evaporated at the same temperature. Just prior to application of the photoresist the evaporation film was cleaned with a rinse of acetone, ethyl alcohol, and Freon after which it was dried with filtered nitrogen. The samples were then vacuum baked at 60° C. for 10 minutes to remove any volatile contaminants, after which they were allowed to cool. Shipley AZ 1350H positive resist, 100-200 ml of which was allowed to stand in a wide mouth container for 24 hours in vacuum, was applied to the surface of the samples with a syringe equipped with a 0.5$\mu$ size millipore filter. The surface of the sample was completely flooded with the resist material, and the sample was allowed to sit for 10 minutes. The resist was then spin coated for 30 seconds at 2000 rpm after which the resist was vacuum baked at 60° C. for 25 minutes and allowed to cool. The circuit was exposed through a pattern mask to a highly collimated light beam supplied by an arc lamp with an intensity of 550 ft. candles for 9 seconds. The pattern was spray developed using Shipley developer AZ 1350H for 40-50 seconds. The resist was then post-baked for 10 minutes in a vacuum oven at 60° C. and allowed to cool. Five microns of copper were plated using the bath of Table I, maintained at room temperature and agitated at the rate of 16 cycles per minutes with a plating current density of 39.5 ma/cm$^2$. An 800 A layer of permalloy was then plated above the copper circuitry. The resist was removed by soaking the sample for one minute in acetone, followed by a fresh acetone, ethyl alcohol, and Freon rinse. The copper cathode was then removed by spray etching with ammonium persulfate bath (100 g/l) for 6-9 seconds. The titanium adhesion layer was subsequently removed by immersing the sample for 3-6 seconds in a 5 percent solution of HF.

EXAMPLE II

Two micron thick lines, 5 microns wide with 3 micron spaces between lines may be deposited on a silicon wafer substrate as interconnections for semiconductors fabricated on the substrate. From 50 A to 100 A of tantalum is evaporated on the substrate after which 250 A of gold is evaporated. The sample is cleaned and baked as in Example I and Shipley AZ 1350H positive photoresist as received from the Shipley Company, is flooded onto the sample with a syringe equipped with 0.5$\mu$ millipore filter. The resist is allowed to stand for 15 seconds, after which it is spun at 2000 rpm for 30 seconds. The resist is baked as in Example I and exposed to a collimated beam of light from a mercury lamp with a 550 ft-candle intensity for 6 seconds. The resist is developed, post-baked, after which 2 microns of gold is plated using the bath of Table III used as received from the Selrex Corp., Nutley, N.J. The bath is maintained at room temperature with agitation and plated at a current density of 10 ma/cm$^2$. The resist is removed as in Example I and the gold cathode layer and tantalum adhesion layer between lines may be removed by sputter etching.

EXAMPLE III 5 micron wide lines with 3 micron spaces and 5 microns thick were deposited on an Al$_2$O$_3$ dielectric on top of plated permalloy. Evaporated layers of chromium and copper were deposited, cleaned and baked as set out in Example I. Shipley AZ 1350H resist, as received, was flooded onto the surface of the sample with a syringe equipped with a 0.5$\mu$ millipore filter. The resist was allowed to sit for 1.5 minutes, after which it was spun at 2000 rpm for 30 seconds. The coating was baked, exposed and developed using the same procedure as in Example I. The resist was then post-baked in vacuum for 20 minutes at 110° C. The resist coating, as received, was again flooded over the sample with a syringe equipped with a millipore filter. The resist was allowed to remain on the surface for 1.5 minutes after which it was spun at 2000 rpm for 30 seconds. The material was again baked, exposed and developed as set out in Example I, but particular care was taken to align the mask for the second exposure with the first developed pattern. Conductors were plated using the bath and parameters of Example I to a thickness of 5 microns. The resist was then removed and the evaporated cathode layers of copper were etched using the ammonium persulfate bath of Example I followed by a 10% AlCl$_3$ bath for the etching of chromium.

While the invention has been shown and described with reference to preferred embodiments thereof, it will be appreciated by those of skill in the art that variations in form may be made therein without departing from the spirit and scope of the invention.

What is claimed is:

1. A process of depositing a uniform layer of photoresist comprising the steps of:
    flooding a positive liquid photoresist onto the substrate;
    preselecting the desired thickness of the ultimate resist layer by measuring a predetermined interval of time while partially drying the liquid resist for a preliminary stationary drying time following flooding; and
    spinning the resist subsequent to the end of said stationary drying time to produce a uniform coating with the thickness increasing with the amount of time allowed for partial drying.

2. A process for producing a uniform layer of photoresist of a desired thickness comprising the steps of:
    flooding a liquid photoresist onto a substrate,
    preselecting the desired thickness of the ultimate resist layer by measuring time while partially drying the liquid photoresist for a predetermined preliminary stationary drying time chosen as a known function of the desired ultimate thickness of the photoresist at the completion of the process, and
    spinning the substrate coated with said photoresist commencing at a time subsequent to said stationary drying time to produce a uniform coating of said desired thickness as a function of said interval of time.

3. A process for producing a uniform layer of photoresist on a substrate with a given thickness comprising the steps of:
    flooding a liquid photoresist onto the substrate,
    measuring an interval of time for partially drying the liquid photoresist for a given stationary drying time having a minimum value of about 15 seconds up to a larger value which is predetermined for said given thickness, and
    spinning the substrate coated with photoresist at a given rpm for a given time commencing subsequent to said stationary drying time to produce a uniform coating, at least 2 microns thick, of a predetermined thickness as a function of the value of said given stationary drying time.

4. A process of depositing a uniform layer of photoresist with a predetermined thickness, comprising the steps of:
    flooding a positive liquid photoresist onto a substrate;
    providing a predetermined time for partially drying the liquid photoresist between resist application and spinning for a measured predetermined stationary drying interval which is varied in duration as a known function of the desired ultimate thickness of the resist at the completion of the process; and
    spinning the photoresist at a speed on the order of 2000 rpm subsequent to the end of said predetermined time to produce a uniform coating with the thickness being proportional to the amount of time allowed for partial drying.

5. A process of fabricating a desired photoresist pattern in a photoresist coating of predetermined thickness applied to a substrate, said process comprising the steps of:
    flooding a liquid photoresist onto said substrate,
    providing a predetermined time for partial drying of said liquid photoresist between resist application and spinning for a measured predetermined stationary drying interval which is varied in duration as a known function of the desired ultimate thickness of the resist at the completion of the process;
    spinning the substrate coated with said photoresist at a speed on the order of 2000 rpm commencing at a time subsequent to said stationary drying time to produce a uniform coating with the thickness being proportional to the amount of time allowed for partial drying; and
    baking, exposing through a suitable mask and developing said photoresist so as to produce said desired pattern in said photoresist.

6. A process of depositing a uniform layer of photoresist with a predetermined thickness on a substrate, said process comprising the steps of:
    flooding a liquid photoresist onto said substrate,
    providing a predetermined time for partial drying of said liquid photoresist between flooding of photoresist and spinning for a measured predetermined stationary drying interval which is varied in duration as a known function of the desired ultimate thickness of the resist at the completion of the process in accordance with the relationship as follows:

| Thickness (Microns) | Time |
|---|---|
| 2.0 | 15.0 seconds |
| 2.5 | 1.5 minutes |
| 3.0 | 3.5 minutes |
| 4.0 | 7.0 minutes |
| 5.0 | 10.0 minutes |
| 10.0 | 27.0 minutes |
| 15.0 | 45.0 minutes | and
    spinning the substrate with photoresist thereon at a speed on the order of 2000 rpm for a given time commencing subsequent to said stationary drying time to produce a uniform coating with the thickness being proportional to the amount of time allowed for partial drying.

7. A process of depositing a uniform layer of photoresist on a substrate comprising the steps of:
    flooding a positive liquid photoresist onto said substrate,
    preselecting the desired thickness of the ultimate resist layer by measuring a predetermined interval of time while partially drying the liquid resist for a preliminary stationary drying time following flooding in accordance with the relationship as follows:

| Thickness (Microns) | Time |
|---|---|
| 2.0 | 15.0 seconds |
| 2.5 | 1.5 minutes |
| 3.0 | 3.5 minutes |
| 4.0 | 7.0 minutes |
| 5.0 | 10.0 minutes |
| 10.0 | 27.0 minutes |
| 15.0 | 45.0 minutes | and
 spinning the resist subsequent to the end of said stationary drying time to produce a uniform coating with the thickness increasing with the amount of time allowed for partial drying.

8. A process for producing a uniform layer of photoresist of a desired thickness comprising the steps of:
 flooding a liquid photoresist onto a substrate,
 preselecting the desired thickness of the ultimate resist layer by measuring time while partially drying the liquid photoresist for a predetermined preliminary stationary drying time chosen as a known function of the desired ultimate thickness of the photoresist at the completion of the process in accordance with the relationship as follows:

| Thickness (Microns) | Time |
|---|---|
| 2.0 | 15.0 seconds |
| 2.5 | 1.5 minutes |
| 3.0 | 3.5 minutes |
| 4.0 | 7.0 minutes |
| 5.0 | 10.0 minutes |
| 10.0 | 27.0 minutes |

-continued

| Thickness (Microns) | Time |
|---|---|
| 15.0 | 45.0 minutes | and
 spinning the substrate coated with said photoresist commencing at a time subsequent to said stationary drying time to produce a uniform coating of said desired thickness as a function of said interval of time.

9. A process for producing a uniform layer of photoresist on a substrate with a given thickness comprising the steps of:
 flooding a liquid photoresist onto said substrate,
 measuring an interval of time for partially drying the liquid photoresist for a given stationary drying time having a minimum value of about 15 seconds up to a larger value which is predetermined for said given thickness in accordance with the relationship as follows:

| Thickness (Microns) | Time |
|---|---|
| 2.0 | 15.0 seconds |
| 2.5 | 1.5 minutes |
| 3.0 | 3.5 minutes |
| 4.0 | 7.0 minutes |
| 5.0 | 10.0 minutes |
| 10.0 | 27.0 minutes |
| 15.0 | 45.0 minutes | and
 spinning the substrate coated with photoresist at a given rpm for a given time commencing subsequent to said stationary drying time to produce a uniform coating, at least 2 microns thick, of a predetermined thickness as a function of the value of said given stationary drying time.

* * * * *